United States Patent [19]

deBarbadillo, II et al.

[11] Patent Number: 4,962,085
[45] Date of Patent: Oct. 9, 1990

[54] PRODUCTION OF OXIDIC SUPERCONDUCTORS BY ZONE OXIDATION OF A PRECURSOR ALLOY

[75] Inventors: John J. deBarbadillo, II, Barboursville; Gaylord D. Smith, Huntington, both of W. Va.

[73] Assignee: Inco Alloys International, Inc., Huntington, W. Va.

[21] Appl. No.: 180,375

[22] Filed: Apr. 12, 1988

[51] Int. Cl.$^5$ ............... H01L 39/12; C01F 17/00; C01G 3/02; C22C 29/12

[52] U.S. Cl. ................... 505/1; 505/736; 505/742; 148/284; 148/282; 148/277

[58] Field of Search ............. 148/6.3, 277, 282, 284; 505/1, 736, 742

[56] References Cited

U.S. PATENT DOCUMENTS

| | | | |
|---|---|---|---|
| 4,729,801 | 3/1988 | Kazumasa et al. | 148/133 |
| 4,761,263 | 8/1988 | Politis et al. | 419/33 |
| 4,826,808 | 5/1989 | Yurek et al. | 505/1 |

FOREIGN PATENT DOCUMENTS

WO88/10010 12/1988 Fed. Rep. of Germany.
265853 11/1988 Japan.
1254542 11/1971 United Kingdom.

OTHER PUBLICATIONS

Chem. Abs. 107-247603d "Direct Synthesis of a Metal-/etc.", J. Elect. Chem. Soc. 1987, 134(10)2635-6.
"Superconducting Microcomposites by etc.," Yurek et al., Journal of Metals, Jan. 1988, pp. 16-18.
"Preparation of a High Tc etc.," Matsuzeki et al., Japanese Journal of Applied Physics, Apr. 1987, pp. LL334-LL336.
"Formation of Perovskite Surface etc.", Gruen et al., J. Elect. Chem. Society, vol. 134, No. 6, Jun. 1987.
Chem. Abs. 107-248033e "Synthesis of a Superconducting etc. Metall. Trans. A" 1987 18A(10)1813-1817.

Primary Examiner—Norman Morgenstern
Assistant Examiner—Margaret Bueker
Attorney, Agent, or Firm—Francis J. Mulligan, Jr.; Edward A. Steen

[57] ABSTRACT

Discloses a process for producing oxidic superconductors having advantageously textured oxide structures which involves zone oxidizing elongated metallic precursors of the superconductors.

11 Claims, 1 Drawing Sheet

PRODUCTION OF OXIDIC SUPERCONDUCTORS BY ZONE OXIDATION OF A PRECURSOR ALLOY

The present invention is concerned with the manufacture of oxidic-type superconductors and, most particularly, with the manufacture of oxidic-type superconductors in useful forms of wire, tape, thin films, items useful in construction of Josephson effect devices and the like characterized by minimized grain boundary discontinuities.

BACKGROUND OF THE INVENTION

As is well known to the entire world, in the last two years superconductor research has undergone a revolution principally based upon the discovery by Nobel laureates J. G. Bednorz and K. A. Mueller that oxidic-type superconductors exist which have critical temperatures (Tc) above about 45° K. During 1987 and in 1988 to date, researchers around the world have reported on various oxide compositions which reportedly have Tc's ranging up to 273° K. and beyond. While, as applicants' understand it at the time of the present writing, claims of very high Tc's for oxidic-type superconductors are based upon detections of the Meissner effect which have been ephemeral and non-repeatable, it is intended that the scope of this application not be limited to any particular oxidic compound or any particular oxidic system so long as the material in question has use in the superconducting field.

A quick survey of the recent technical literature through Chemical Abstracts has indicated that the following oxidic materials including compounds, phases, mixtures, doped materials, etc. have been proposed for superconducting use:

$YBa_2Cu_3O_{7-x}$
$MBa_2Cu_3O_7$ M=Nd, Dy, Er, Tm or mixtures
$MBa_2Cu_3O_6$ M=Sa, Ho
$La_{2-x}Sn_xCuO_4$
$La_2CuO_4$ doped with fluorine
$YBa_2Cu_3O_{6.8}$ doped with fluorine
$EuBa_2Cu_3O_{9-x}$
$EuBa_2(Cu_{1-y}M_y)_3O_{9-x}$ M=Cr, Mn, Fe, Co, Ni or Zn
$GdBaCu_3O_{7-x}$
$Ba_2SmCu_3O_{9-x}$
$InSnO_2$
$La_{2-x}M_xCuO_4$
$La_{2-x}Sr_xCuO_4$
$Ba_2YCu_3O_{9-y}$
$GdBa_2Cu_3O_{7-x}$
$YBa_2(Cu_{1-x}Fe_x)_3O_{7-y}$
$(Y_{1.2}Ba_{0.8})_4Cu_4O_{16-x}$
$YBa_3Cu_3O_yF_x$
$Y_{3-x}Ba_xCu_2O_{7-y}$
Bi-Sr-Cu-O system
$La_{3-x}Ba_{3-x}Cu_6O_{14-y}$
$YBa_2Cu_3O_{7-x}S_y$
$EuBa_2Cu_3O_x$
$YBa_2Cu_3O_{9-y}$
$La_{1.85}Sr_{0.15}CuO_4$
$Ba_2RCu_3O_x$ R=Gd, Ho, Er or Dy
$YBa_2(Cu_{1-x}Ag_x)_3O_{7-y}$
$YBa_2(CuO_{0.94}FeO_{0.06})_3O_{9-y}$
$YBa_2Ag_3O_x$
$La_2CuO_{4-y}$
$Dy_xBa_{1-x}CuO_{3-y}$
Molybdenum Oxides and Bronzes - Alkali Molybdenum Bronze
(Y, Ho)$Ba_2Cu_3O_7$
Nb, Si, Al oxides Japanese Pat. Appln. No. 87-170,108
Ge, Al, Nb oxides Japanese Pat. Appln. No. 87-171,924
$BaPb_{1-x}Bi_xO_3$
$Nb/Al/Al_2O_3$
Nb/Ge-Al-O
Pb, Bi, In oxides $Li_{1-x}Ti_{2-x}O_4$
$TlCaBa_2Cu_2O_{8+x}$
$TlCa_2Ba_2Cu_3O_{10+x}$ Those acquainted with the art will appreciate that the foregoing list of oxidic superconductors (or more accurately materials suggested for superconductor use) is not exhaustive and is increasing on a day-to-day basis. For example, on page 36 of the April 1988 edition of Scientific American a new superconductor is reported as composed of bismuth, strontium, calcium, copper and oxygen. The superconductor reportedly having a Tc as high as 84° K. apparently can also contain aluminum. Those persons will also appreciate that where exact compositions are listed, in reality any element in the composition may be present in a sub- or super-stoichiometrical amount and may be limited to or substituted in whole or in part with a particular isotope of the element in question such as $O^{18}$, $Gd^{155}$, etc. The superconductor composition may also be doped with metals, metalloids and non-metals. Each and all of these variations and others are contemplated within the term "oxidic superconducting materials" as employed in this specification and claims. Currently, known ways of preparing such oxidic superconducting materials are disclosed in the review by M. Hirabayashi in Nippon Kinzoku Gakkai Kaiho 1987, 26(10), pages 943-949, Chemical Abstract Reference 108-66605f. Reference is also made to the paper "Synthesis of a Superconducting Oxide by Oxidation of a Metallic Precursor", Yurek et al, Metallurgical Transactions A, Vol. 18A, October 1987, pp. 1813-1817, the brief communication "Direct Synthesis of a Metal/Superconducting Oxide Composite by Oxidation of a Metallic Precursor", Yurek et al, JAECS, October 1987, pp. 2635-2636 and the paper "Superconducting Microcomposites by Oxidation of Metallic Precursors, Yurek et al, Journal of Metals, January 1988, pp. 1614 18. Those skilled in the art appreciate that oxidic super-conductors are essentially ceramic-like materials which are not readily formable into desirable product configurations such as wire, tape, coils, etc. The purpose of the present invention is to provide an improved method of making oxidic superconductors starting with a metallic superconductor precursor.

DESCRIPTION OF THE INVENTION

Figure 1:
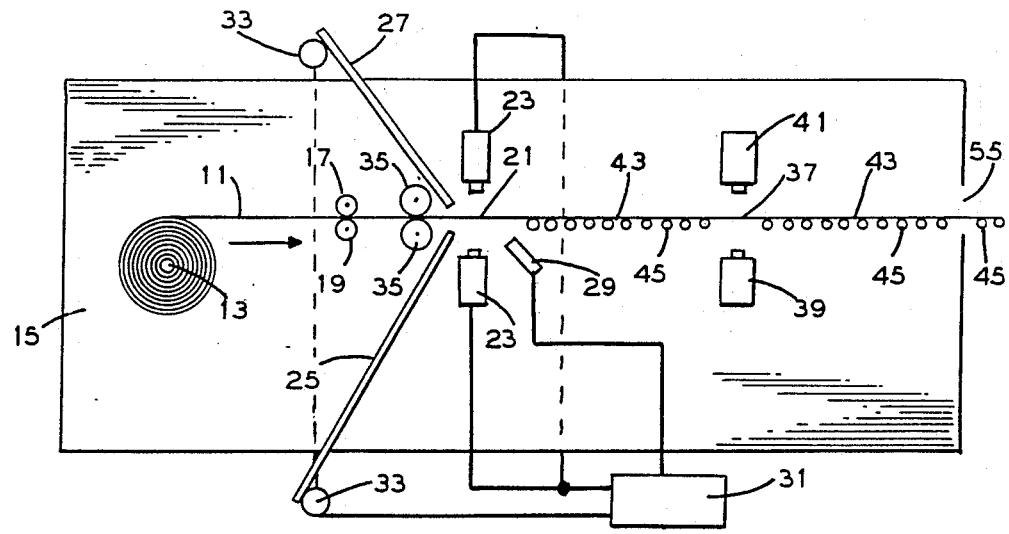
FIG. 1 is a schematic view of an apparatus for carrying out the process of the present invention.

The present invention contemplates treating a metallic superconductor precursor having a thin elongated structure such as a wire, thin film, strip or tape by substantially continuously feeding said thin, elongated structure through an oxidizing zone of restricted dimension wherein, in the presence of an oxygen source such as air, air enriched with oxygen, oxygen, oxygen-inert gas mixtures all with or without ozone, nitrogen oxides or oxygen-containing free radicals or ions, at least a portion of the thin, metallic precursor is zone oxidized to, or substantially to, a desired oxidic superconductor, and withdrawing the thus oxidized, thin elongated structure from said oxidizing zone to thereby provide a textured, aligned oxide superconductor structure having minimized grain boundaries. It is within the contemplation of the invention to prepare fluoridized oxidic superconductors by inclusion of elemental fluorine, hydrogen fluoride, sulfur hexafluoride and the like in the atmosphere surrounding the oxidizing zone. In like manner, some sulfur can be incorporated into the oxidic superconductor product by inclusion of $SO_2$ in the oxidizing atmosphere although greater efficiency of sulfur inclusion may be achieved by dispersing a stable sulfate, e.g. $BaSO_4$, $CaSO_4$ in the metallic precursor, e.g. by mechanical alloying as discussed hereinafter.

Co-pending herewith and assigned to applicants' assignee is applicants' patent application which describes and claims a method of making oxidic superconductor precursors using the technique of mechanical alloying of metal powder in the presence of a process control agent, e.g. gaseous oxygen. It is highly advantageous to employ this claimed method of production to provide the oxidic superconductor metallic precursors which are the starting point for the process of the present invention. As disclosed in this co-pending U.S. patent application Ser. No. 07/180,374, it has been suggested that... "certain compounds be doped with or caused to contain fluorine or sulfur in place of or in addition to oxygen. Such halide and chalcogenide dopants can be included in whole or in part in the oxidic superconductor precursor during the mechanical alloying process either as a modifier to a process control agent or as an initial charge ingredient provided that the total of the dopant form, e.g. metal fluoride and the form of the residue of the process control agent, e.g. metal oxide do not limit the formability of the precursor to preclude manufacture of the ultimate product configuration. As a ball park figure the total of oxygen, fluorine and sulfur introduced into the precursor during mechanical alloying should not exceed about 4% by weight of the precursor alloy.

Metallic dopants such as silver, chromium, manganese, iron, cobalt, nickel, zinc, uncommon lanthanides, etc. which are indicated in the art as having utility in oxidic superconductors can be used in practically any amount in metallic form in the mechanical alloying charge used in the process of the present invention. If the metallic dopant is only available in oxide form, such as may be the case for some of the rarer lanthanides, the inclusion of such oxide in a mechanical alloying charge is limited as is the processing aid and the halide and chalcogenide dopant. If such rare lanthanide oxide is employed, the oxygen therein should be subject to the aforestated 4% maximum total, oxygen plus fluorine plus sulfur." Those skilled in the art will thus appreciate that when using the most advantageous mechanically alloyed metallic precursor starting material for the process of the present invention, that material will initially contain some oxygen and thus cannot be totally oxidized in the oxidizing zone. Precursor alloy can also be made by melt, rapid solidification technology. Generally metallic precursor made by rapid solidification technology, e.g. cryogenic ribbon casting will possess a mixed grain structure and contain very little oxygen initially. However, it is contemplated by the present invention that oxidation in the oxidizing zone of this and of material made by mechanical alloying can be carried out only part way, sufficient to establish oxidic crystal format, and oxidation completed in a subsequent zone oxidizing or overall oxidizing step.

As disclosed in the co-pending U.S. patent application Ser. No. 07/180,374, the oxidic superconductor precursor can be layered upon or caused to contain volumes of metal which are not oxidized in the final product. Metals such as gold and silver, aluminum and gold- or silver-clad or plated copper, aluminized copper in continuous strand or wire form are advantageous in an oxidic superconductor in that they tend to reduce superconductor brittleness, provide a convenient means for connecting the superconductor to conventional electrical circuitry and provide, during use, a shunt means in the event superconducting conditions of temperature, current density or magnetic field strength are breached. Consequently, it is within the contemplation of the present invention to employ as the oxidic superconductor precursor a metallic configuration in which a not readily oxidizable metal is present either as a composite elongated massive structure or structures or as an alloy component adapted, upon oxidation of oxidizable elements to form a microweb of metal throughout the oxide superconductor. likewise, it is within the contemplation of the present invention to zone oxidize a metallic precursor wire or strip so as to produce oxidic superconductor as a thin surface film on the precursor metal which may contain or be backed by a non-oxidized metallic electrical conductor such as gold, silver, copper, aluminum, etc. It is also contemplated to zone oxidize a precursor metal film such as produced by sputtering on a non-oxidizable electrically conducting metal base to provide a film of textured oxidic superconductor on the base.

In carrying out zone oxidation in accordance with the present invention it is advantageous to provide a limited zone in which wire or strip of the metallic precursor of the oxidic superconductor can be heated by induction, electron bombardment, radiation, Joule heating, etc. to a temperature below the melting point of the lowest melting phase present in the presence of a source of oxygen or oxidizing gas. Sources of oxygen including the ubiquitous air have been listed hereinbefore. A caution is given with respect to the use of air and nitrogen oxides as oxidants in that some metallic precursors of oxidic superconductors contain elements such as barium and lanthanides which can readily form stable nitrides. In the case of such precursor alloys it is advantageous to employ oxygen as the oxidizer either alone at atmospheric, subatmospheric or super-atmospheric pressure or in combination with an inert gas such as argon. The temperature induced in the precursor alloy in the oxidizing zone or, alternatively, the energy inputted to the oxidizing zone, must be moderated to account for any exothermic heat of reaction during metal oxidation. Conditions must be maintained such that no liquid phases are produced in the precursor alloy because production of liquid phases can lead to undesirable segregation of the metallic constituents of the oxidic superconductor. Consequently, it is sometimes advantageous to conduct the zone oxidation to only a limited extent, e.g. up to about 75% of theoretical oxidation sufficient to establish the oxidic crystal structure and then complete oxidation at a higher temperature in a conventional furnace with an oxidizing atmosphere. Dual or multiple oxidation operations and/or thermally induced conditioning operations in an oxidizing atmosphere are contemplated in addition to the initial zone oxidation of the present invention in order to fine tune the superconducting characteristics of the oxidic superconductors produced by the process of the present invention. Those skilled in the art will note that in the bulk of oxidic superconductor formulae set forth hereinbefore in the section "Background of the Invention", oxygen is subscripted by a digit minus x or y. Generally x or y denotes a decimal less than 1 but, at this stage of oxidic superconductor development, is somewhat indefinite. The control of this oxygen stoichiometric deficiency (i.e. x or y) is most conveniently accomplished by thermally conditioning substantially completely oxidized metallic precursor at temperature - oxygen partial pressure conditions peculiar to each individual composition. This conditioning can involve heat treatments at more than one temperature or over a range of temperatures perhaps inclusive of an oxidic phase transformation. The end result, however, is an oxidic superconductor stable at superconducting temperatures containing one or more phases of optimized oxygen stoichiometry deficiency.

An additional advantageous feature, particularly adapted to be employed with oxidic superconductor precursor alloy made by mechanical alloying and having a fine crystal structure is to zone anneal the precursor alloy prior to zone oxidation. Zone annealing involves passing an elongated form, e.g. wire or strip, of the precursor alloy through a limited zone in which the metal is heated to a temperature below the melting point of any phase present but above the recrystallization temperature of the alloy and thereafter relatively rapidly cooling the metal which is passed through the zone. As the metal passes through the annealing zone, it starts to recrystallize and relative motion between the zone and the metal causes the formation of an elongated crystal structure where the ratio of crystal length to cross section dimension is high, perhaps 10 or greater. Zone annealing minimizes grain boundary areas in the precursor alloy and any detrimental effect such grain boundary areas of modified composition will have on the oxidic superconductor. The use of zone annealed material in the zone oxidation process of the present invention is believed to minimize oxidic crystallization sites leading to a more advantageously textured oxidic superconductor product. In order to facilitate the zone annealing operation it is advantageous that the input precursor alloy contain residual cold working energy. As those skilled in the art are aware, zone annealing is generally carried out in an atmosphere inert to the metal being annealed. However, in the case of oxidic superconductor precursor alloys it may be possible to zone anneal and zone oxidize in an apparatus in which the annealing zone is exposed to only a little of the oxidizing agent fed to the oxidizing zone.

Referring now to the drawing the process of the present invention is schematically depicted in FIG. 1 thereof. FIG. 1 shows an oxidic superconductor precursor alloy 11 in strip form on payout reel 13 in an overall casing 15. Precursor alloy 11 for purposes of this example is the alloy made in Example II of co-pending U.S. patent application Ser. No. 07/180,374 which contains about 18.4% copper, about 80.6% lanthanum, about 0.25% fluorine and about 0.7% oxygen. Strip of precursor alloy 11 is fed left to right by drive rolls 17 and 19 into and through at least one oxidation zone 21. Oxidation zone 21 is provided with means, e.g. induction or laser means 23 to heat the initial portion of precursor alloy strip to about 400° C. and oxygen is fed to oxidation zone 21 through conduits 25 and 27 at a rate of about 0.15 liter per each gram of precursor alloy strip 11 oxidized in oxidation zone 21. Sensor 29, advantageously a detector of electromagnetic radiation of frequency other than that of laser means 23, is provided to detect onset and continuity of oxidation. As soon as oxidation starts in zone 21, sensor 29 connected to the control mechanism 31 for laser means 23 provides a signal which cuts off energy input to zone 21 from laser means 23. If oxidation in zone 21 falters, sensor 29 again provides a signal to activate laser means 23 to provide input energy sufficient to reinitiate oxidation. Control of oxidation can also be accomplished by varying the amount and temperature of oxygen fed to zone 21. Also connected to control mechanism 31 for laser means 23 is oxygen flow sensor 33 which permits activation of laser means 23 only when oxygen is actively flowing into zone 21. The oxidation of the particular lanthanum, copper, fluorine, oxygen, precursor alloy considered here is highly exothermic producing on a standard free energy basis of simple oxidation about 1350 calories per gram of metal oxidized. When performing such exothermic oxidations of precursor alloys rich in the total of elements such as yttrium, lanthanum and lanthanides, barium, strontium, calcium and aluminum, it may be necessary, depending upon the rate of oxidation, to provide one or more chill elements 35 on the metal side of oxidation zone 21 in order to prevent melting or partial melting of the precursor alloy. Further it can be advantageous to provide on the oxide side of oxidation zone 21 a zone annealing station 37 in which crystals of solid oxide are further textured to needle-like or elongated plate-like configuration. Those skilled in the art will appreciate that zone annealing of oxidic material can also be carried out as a separate operation as a part of, in addition to or as a substitute for thermal conditioning operations of oxidic superconductors discussed hereinbefore. As is conventional, zone annealing is carried out by introducing into a zone sufficient energy to raise the temperature of the oxidic structure in the zone to above the solid state recrystallization temperature of the material but generally below the melting point and causing substantially continuous relative motion between the substrate being heated and the heat source. Conveniently this can be done by imparting energy by laser beam and either causing the oxide to move relative to a stationary beam or causing the beam to scan the oxidic material. As depicted in FIG. 1 two beams from lasers 39 and 41 can be used, one below and one above a horizontally oriented moving strip. On the oxide side of oxidizing zone 21, moving oxidized strip 43 is conveniently supported by run-out table 45.

Figure 2A:
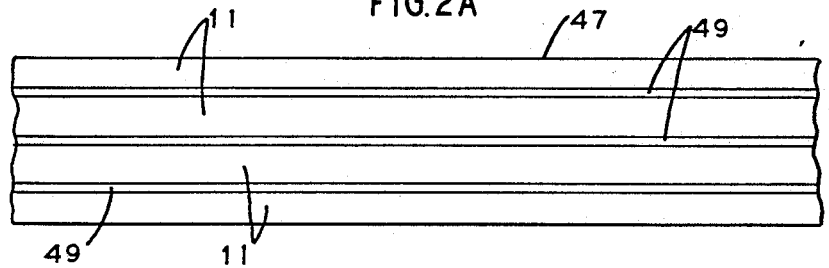
FIG. 2A is a plan view of a superconductor precursor alloy strip which can be used in the process of the present invention.
Figure 2B:
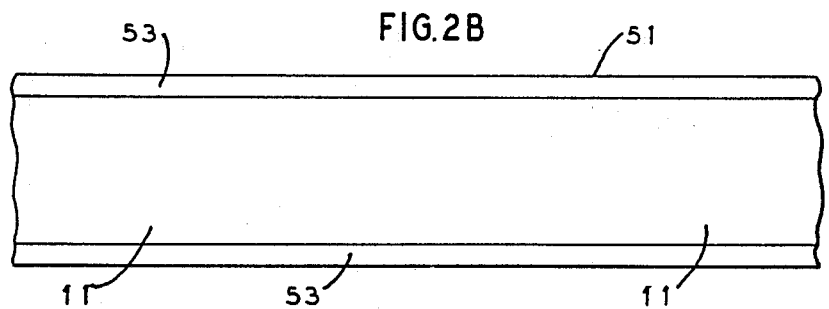
FIG. 2B is a plan view of an alternative superconductor precursor alloy strip which can be used in the process of the present invention.

FIGS. 2A and 2B depict variations of oxidic superconductor precursor alloy strip which can be used in the process as depicted in FIG. 1. In FIG. 2A strip 47 comprises precursor alloy 11 which has strands 49 of a non-oxidizable metal, e.g. gold thereon. These strands 49 are advantageously introduced onto or into the precursor alloy during cold rolling of the strip to final dimension during its manufacture. The advantage of strip 47 and similar strip containing micromesh forms of non-oxidizable metal, e.g. gold, is that with such strip oxidation zone 21 can be reliably heated by electromagnetic induction to initiate oxidation and oxidation can be restarted even when substantial amounts of metal have been oxidized. Of course, as is known to those skilled in the art, the frequency of the inducing current must be matched to the dimensions, especially thickness of the metal being heated. FIG. 2B shows strip 51 having non-oxidizable metal edges 53 also provided during manufacture by cold rolling. The advantage of strip 51 as depicted in FIG. 2B is that energy can be reliably introduced into strip 53 at the oxidizing zone by Joule heating employing a rolling or sliding contact on each edge connected to an external electrical circuit of suitable voltage and current carrying capacity. Such an external circuit is controlled in the same manner as accomplished by control mechanism 31 for laser means 23 to prevent excessive heating in the absence of the flow of oxidizing gas and when oxidation is taking place. Control can also be provided sensitive to the motion of precursor alloy 11 through oxidizing zone 21.

Because of the wide variations in emissivity coefficients of precursor metals and oxides, heat sink characteristics and temperatures, incipient molten phase temperatures for precursor metals and oxides and rates of oxidation and convection heat transfer it is impossible to specify with accuracy energy inputs to oxidation zone 21 to initiate and maintain oxidation without causing melting or partial melting of metal prior to entry into oxidation zone 21. However, the general rules are that oxidation should be initiated at the lowest temperature practical and that the rate of supply of oxidizing gas to oxidation zone 21 should not be greater than the capacity of chills 35 to remove heat of oxidation not dissipated by radiation or convection so as to maintain metal temperature outside of oxidation zone 21 safely below the melting temperature of the lowest melting phase possible. In oxidic superconductor compositions containing low melting point metals such as lead, bismuth and thallium, oxidation will generally have to be conducted very slowly especially in cases where the precursor alloy contains relatively large amounts of metals having a high oxidic heat of formation, e.g. barium, strontium, calcium, etc.

Those skilled in the art will appreciate that the apparatus as depicted in FIG. 1 of the drawing is highly schematic. Many variations and additions are possible. For example, when oxidizing in air or oxygen-inert gas mixtures it may be necessary to provide power exhaust capability which will purge nitrogen or inert gas more rapidly than natural flow through product exit port 55 will provide: Chill elements 35 can be incorporated in drive rolls 17 and 19: Additional oxygen conduits can be provided at zone 37 to complete oxidation not finished in zone 21 or to inhibit thermal decomposition already formed: Conventional means for operation at either subatmospheric or super-atmospheric pressures can be provided and: High voltage ionization corona means or ionizing radiation, e.g. U.V. can be provided to accelerate oxidation, especially that necessarily conducted at low temperature. Other variations as to FIG. 1 will be apparent to those of skill in the art.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows.

1. A process for producing an oxidic superconductor comprising exposing an elongated body of metallic oxidic superconductor precursor alloy to at least one oxidation zone of limited dimension, initiating and continuing oxidation in said at least one zone in the presence of an oxidizing gas to thereby at least partly oxidize said precursor alloy and establish oxidic crystal format and causing substantially continuous relative motion between said precursor alloy and said at least one zone to provide on one side of said at least one zone unoxidized metal and on the other side of said at least one zone textured, elongated oxidic crystals.

2. A process as in claim 1 wherein metallic precursor alloy of an oxidic superconductor is fed into and through a stationary oxidation zone.

3. A process as in claim 2 wherein heat is extracted from precursor alloy entering said stationary oxidation zone to maintain metal temperature below the melting temperature of the lowest melting phase in said precursor alloy.

4. A process as in claim 1 wherein after zone oxidation is complete the thus produced oxide is further textured by zone annealing.

5. A process as in claim 4 wherein oxygen is fed to the zone of annealing to complete oxidation not completed in said oxidation zone and to inhibit thermal decomposition of oxide already formed.

6. A process as in claim 2 wherein the rate of oxidation is controlled by controlling the feed of said oxidizing gas to said oxidation zone.

7. A process as in claim 6 wherein said oxidizing gas is supplied as at least one member of the group consisting of air, oxygen, oxygen enriched air and oxygen-inert gas mixtures.

8. A process as in claim 6 wherein said oxidizing gas is supplied as an oxygen-inert gas mixture.

9. A process as in claim 1 wherein said metallic, oxidic superconductor precursor alloy contains at least one elongated body of inoxidizable metal.

10. A process as in claim 1 wherein said elongated body of metallic, oxidic superconductor precursor alloy is zone annealed prior to being exposed to said oxidation zone.

11. A process as in claim 1 wherein said oxidizing gas contains at least one element from the group consisting of fluorine and sulfur.

* * * * *